United States Patent
Campini et al.

(10) Patent No.: US 7,172,432 B2
(45) Date of Patent: Feb. 6, 2007

(54) STACKED MULTIPLE CONNECTION MODULE

(75) Inventors: Edoardo Campini, Mesa, AZ (US);
Douglas Lee Stahl, Phoenix, AZ (US);
Steven DeNies, East Aurora, NY (US);
Jay Gilbert, Portland, OR (US); Jacek Budny, Gdynia (PL); Gerard Wisniewski, Rotmanka (PL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/096,992

(22) Filed: Mar. 31, 2005

(65) Prior Publication Data

US 2006/0223343 A1 Oct. 5, 2006

(51) Int. Cl.
*H01R 12/00* (2006.01)
(52) U.S. Cl. ............... 439/74; 361/736; 361/790
(58) Field of Classification Search .......... 439/74, 439/59, 75; 361/742, 770, 790, 804, 736
See application file for complete search history.

(56) References Cited

U.S. PATENT DOCUMENTS

| | | | | |
|---|---|---|---|---|
| 2,731,609 A | * | 1/1956 | Sobel, III | 439/74 |
| 2,952,810 A | * | 9/1960 | Helton | 324/537 |
| 3,478,251 A | * | 11/1969 | Ecclesia et al. | 361/736 |
| 3,653,006 A | * | 3/1972 | Kohler et al. | 365/52 |
| 3,736,471 A | * | 5/1973 | Donze et al. | 361/684 |
| 3,794,954 A | * | 2/1974 | Reimer | 439/62 |
| 4,200,900 A | * | 4/1980 | McGeorge | 361/803 |
| 4,331,370 A | * | 5/1982 | Andrews et al. | 439/75 |
| 4,336,569 A | * | 6/1982 | Tsuda et al. | 361/736 |
| 4,540,229 A | * | 9/1985 | Madden | 439/325 |
| 4,840,570 A | * | 6/1989 | Mann et al. | 439/74 |
| 4,998,180 A | * | 3/1991 | McAuliffe et al. | 361/684 |
| 5,008,777 A | * | 4/1991 | Burns | 361/804 |
| 5,519,571 A | * | 5/1996 | Shieh | 361/685 |
| 5,903,439 A | * | 5/1999 | Tamarkin | 361/742 |
| 5,949,657 A | * | 9/1999 | Karabatsos | 361/803 |
| 6,341,066 B1 | * | 1/2002 | Murowaki et al. | 361/707 |

FOREIGN PATENT DOCUMENTS

DE 65268 * 1/1969

* cited by examiner

*Primary Examiner*—Neil Abrams
(74) *Attorney, Agent, or Firm*—Blakely, Sokoloff, Taylor & Zafman LLP

(57) ABSTRACT

A stacked multiple connection module that provides multiple times the input/output (I/O) signal capacity of a single connection module. In one embodiment, a stacked dual connection module includes first and second circuit boards with respective edge connectors maintained at a parallel offset and configured to couple to a mating two slotted stacked edge connector. A connection means is provided to couple signals between the first and second circuit boards, such that components mounted on the first and/or second circuit board are enabled to access I/O signals via both of the edge connectors, thus doubling I/O signal capacity. In one embodiment, the stacked dual connection module comprises an Advanced Mezzanine Card (AdvancedMC) module having edge connectors configured to mate with an AdvancedMC connector.

19 Claims, 12 Drawing Sheets

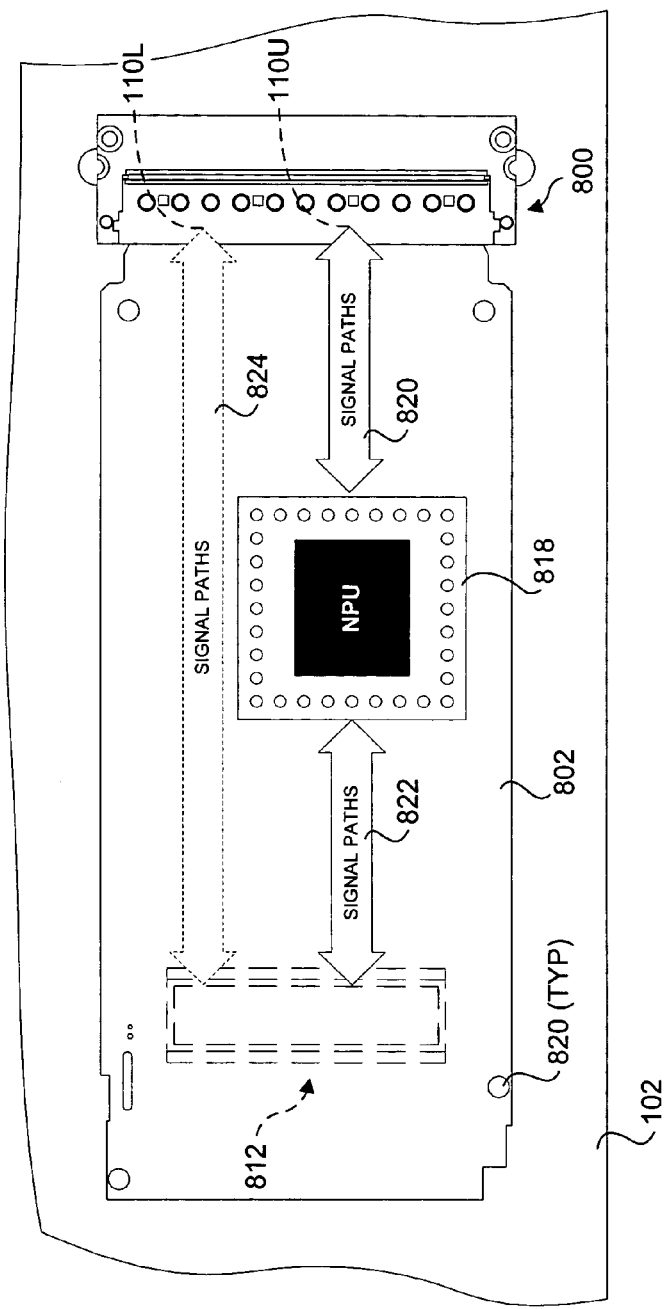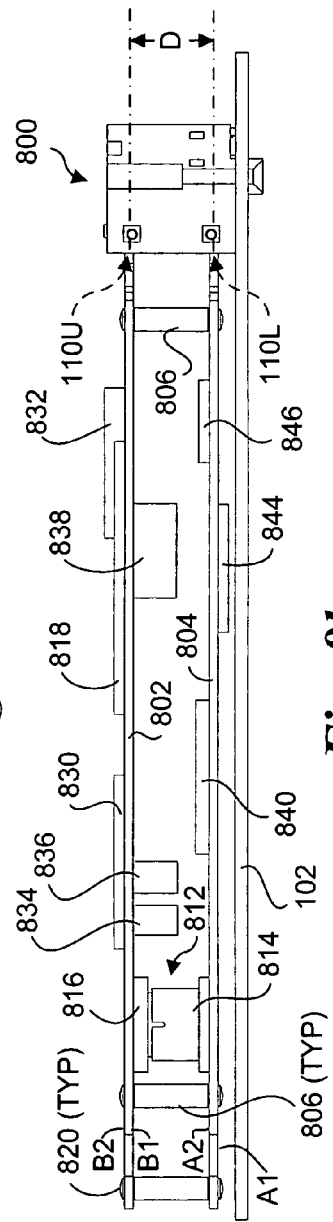
Fig. 8a
Fig. 8b

STACKED MULTIPLE CONNECTION MODULE

FIELD OF THE INVENTION

The field of invention relates generally to computer and telecommunications equipment, and, more specifically but not exclusively relates to a stacked multiple connection module that doubles the number of available input/output channels of a conventional module employing a single connection.

BACKGROUND INFORMATION

The Advanced Telecom Computing Architecture (ATCA) (also referred to as AdvancedTCA) standard defines an open switch fabric based platform delivering an industry standard high performance, fault tolerant, and scalable solution for next generation telecommunications and data center equipment. The development of the ATCA standard is being carried out within the PCI Industrial Computer Manufacturers Group (PICMG). The ATCA Base Specification, PIGMG 3.0 Revision 1.0, published Dec. 30, 2002 (hereinafter referred to as "the ATCA specification") defines the physical and electrical characteristics of an off-the-shelf, modular chassis based on switch fabric connections between hot-swappable blades. The Advanced TCA base specification supports multiple fabric connections, and multi-protocol support (i.e., Ethernet, Fibre Channel, InfiniBand, StarFabic, PCI Express, and RapidIO) including the Advanced Switching (AS) technology.

The ATCA specification defines the frame (rack) and shelf (chassis) form factors, core backplane fabric connectivity, power, cooling, management interfaces, and the electromechanical specification of the ATCA-compliant boards. The electromechanical specification is based on the existing IEC60297 EuroCard form factor, and enables equipment from different vendors to be incorporated in a modular fashion and be guaranteed to operate. The ATCA specification also defines a power budget of 200 Watts (W) per board, enabling high performance servers with multi-processor architectures and multi gigabytes of on-board memory.

Recently, the modularity of the ATCA architecture has been extended to another level, wherein hot-swappable, field-replaceable mezzanine cards (or modules) may be hosted by an ATCA carrier board. Standards for the mezzanine cards/modules and related interfaces are defined by the Advanced Mezzanine Card (AdvancedMC) (also called AMC) specification, PIGMG AMC.0, Revision 1.0, published Jan. 3, 2005 (hereinafter referred to as the AMC.0 specification). Optimized for packet-based, high-availability telecom systems, AdvancedMC modules can be attached to a variety of ATCA and proprietary carrier blades. AdvancedMC modules communicate with the carrier board via a packet-based serial interface, which features up to 21 lanes of high-speed input/output (I/O) at 12.5 Gbit/sec each. The specification defines standard mezzanine module configuration for both full-height and half-height AdvancedMC modules, as well as modules employing single-width and double-width cards. AdvancedMC is slated to support a variety of protocols, including Ethernet, PCI Express, and Serial Rapid I/O. AdvancedMC also features integrated $I^2C$- and Ethernet-based system management. AdvancedMC modules may also be employed for non-ATCA systems.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified:

FIGS. 8a and 8b respectively show plan and elevation views of an embodiment of the invention that employs upper and lower circuit boards that include respective AdvancedMC edge connectors maintained at a offset, and wherein a two-part mating connector is employed to couple signals between the upper and lower circuit boards;

DETAILED DESCRIPTION

Embodiments of stacked multiple connection modules are described herein. In the following description, numerous specific details are set forth, such as implementations for Advanced Mezzanine Card (AdvancedMC) modules and Advanced Telecom Computing Architecture (ATCA) carrier boards and chassis, to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

To better understand the operation and advantages of embodiments of the present invention, a discussion of the configuration and operation of conventional AdvancedMC cards and ATCA carrier boards is first presented. Details of various embodiments that may be employed in AdvancedMC modules then follow.

Figure 1A:
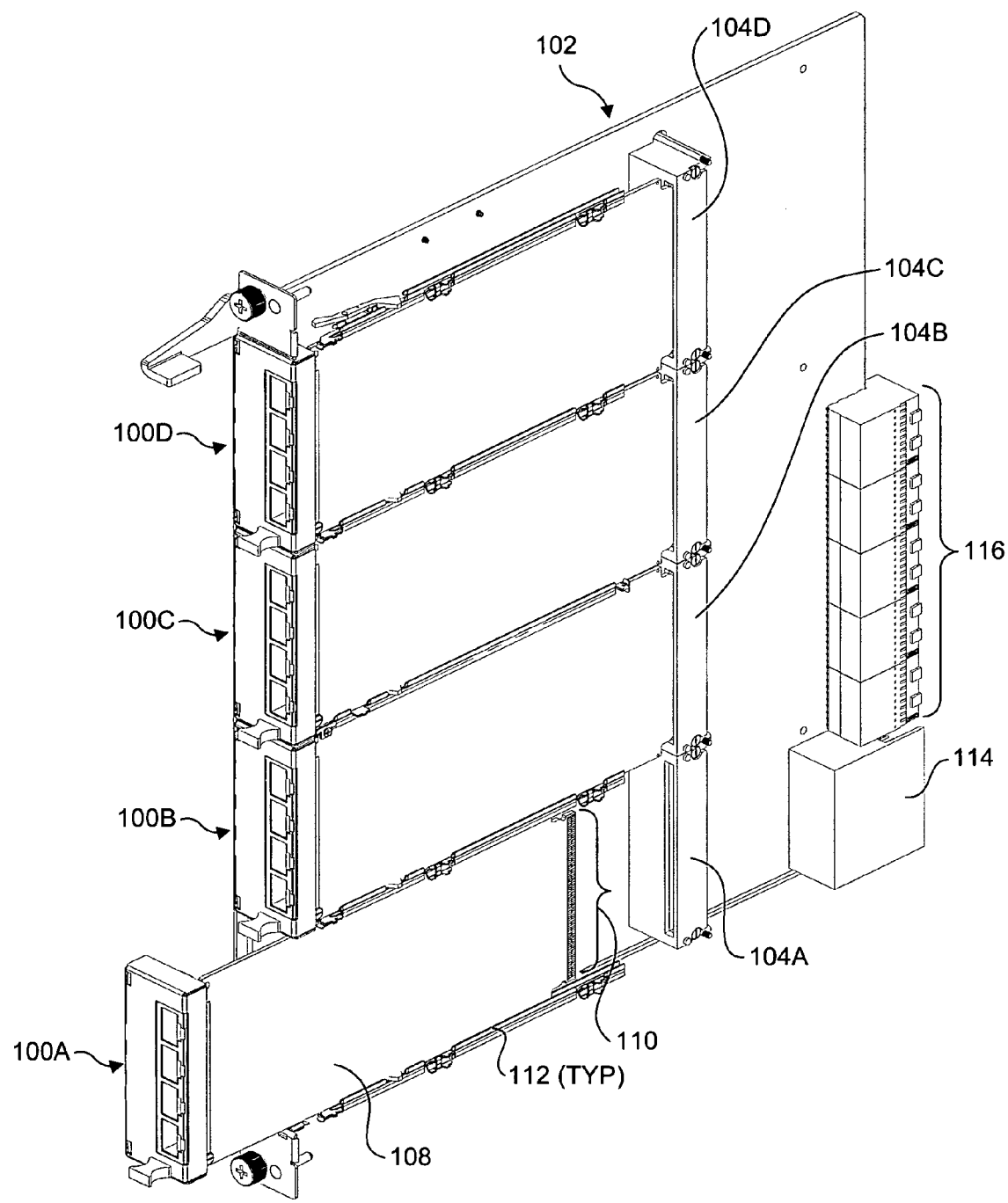
FIG. 1a is an isometric view of an Advanced Telecommunication Architecture (ATCA) carrier board to which four full-height single-width Advance Mezzanine Card (AdvancedMC) modules are coupled.

FIG. 1 shows an exemplary AdvancedMC module implementation wherein four single-width full-height AdvancedMC modules 100A, 100B, 100C, and 100D are installed on an ATCA carrier board 102. In general, ATCA carrier boards may have various configurations, depending on the number and type of AdvancedMC modules the carrier board is designed to host. For example, ATCA carrier board 102 includes four single-width full-height AdvancedMC connectors 104A, 104B, 104C, and 104D.

Figure 1B:
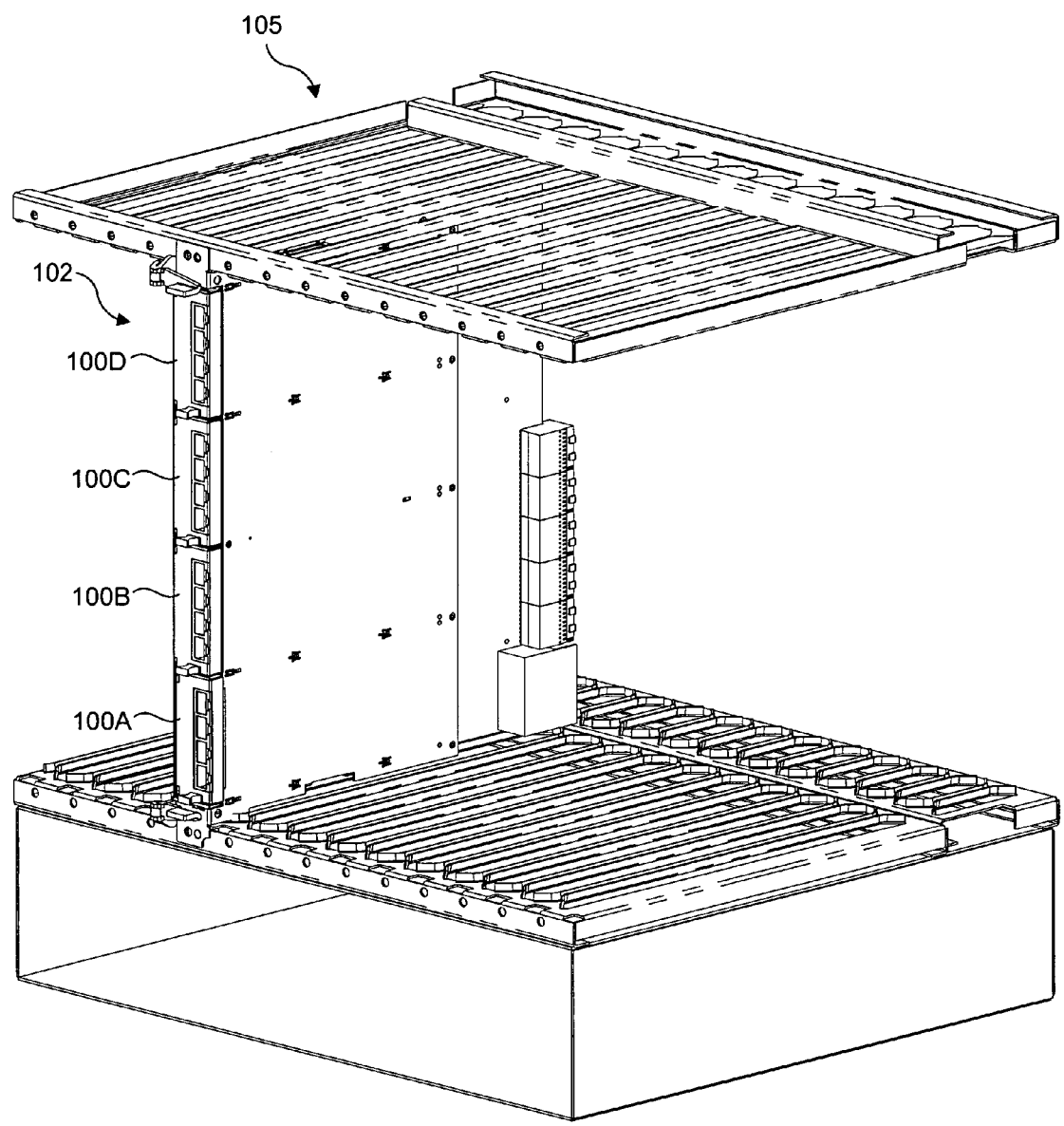
FIG. 1b shows an exemplary ATCA carrier board including four AdvancedMC modules installed in an ATCA chassis.

ATCA carrier boards (also referred to as simply ATCA boards), are configured to be installed in an ATCA chassis. For example, FIG. 1b shows an ATCA carrier board 102 installed in an ATCA chassis 105. For the purpose of simplicity and clarity, the backplane board and connector components for the ATCA chassis, as well as other components including cooling fans and ducting are not shown in FIG. 1b.

Figure 5A:
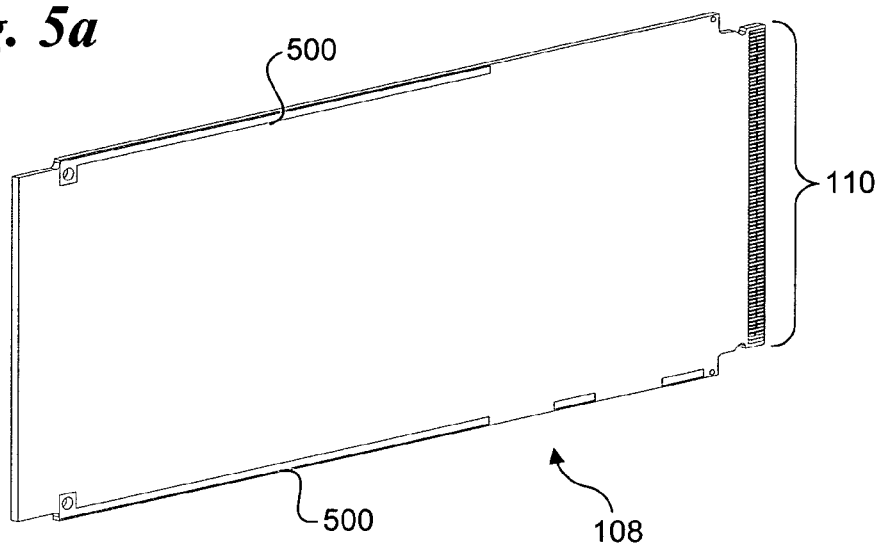
FIG. 5a is an isometric view of a single-width printed circuit board (PCB) card used in a half-height or full-height single-width AdvancedMC module.

Under the AMC.0 specification, full-height AdvancedMC connectors are referred to as Style "B" (basic) or "B+" (extended) connectors. The term "basic" is associated with AdvancedMC connectors that are equipped with contacts on only one side of the connector slot. The term "+" identifies the connector as an extended connector having contacts on both sides of the connector slot. A single-width AdvancedMC module includes a single-width AdvancedMC card 108 having a single-width edge connector 110, further details of which are shown in FIG. 5a. As with its mating connector, a single-width edge connector may include contacts on a single side (basic) or both sides (extended).

The horizontal (or longitudinal) card edges of an AdvancedMC card are guided via a set of guide rails 112 disposed on opposing sides of the card. An ATCA carrier board also includes a power connector 114 via which power is provided to the carrier board from an ATCA chassis backplane, and various input/output (I/O) connectors 116 via which signals are routed to the backplane, and hence to other ATCA boards and/or AdvancedMC modules (mounted to other ATCA carrier boards) that are similarly coupled to the ATCA backplane.

Generally, the circuit components on an AdvancedMC module PCB card will be disposed on the side of the card facing the top or front side of the corresponding carrier board. This protects the circuitry, among other reasons for the configuration. To add further protection, an ATCA carrier board assembly will typically include a cover plate that is disposed over the backside of the AdvancedMC module PCB cards; the ATCA carrier board assemblies of FIGS. 1, 2, and 3, do not show the cover plate for clarity in illustrating how the PCB card edge connectors are mated to corresponding AdvancedMC connectors under a conventional implementation.

Figure 2:
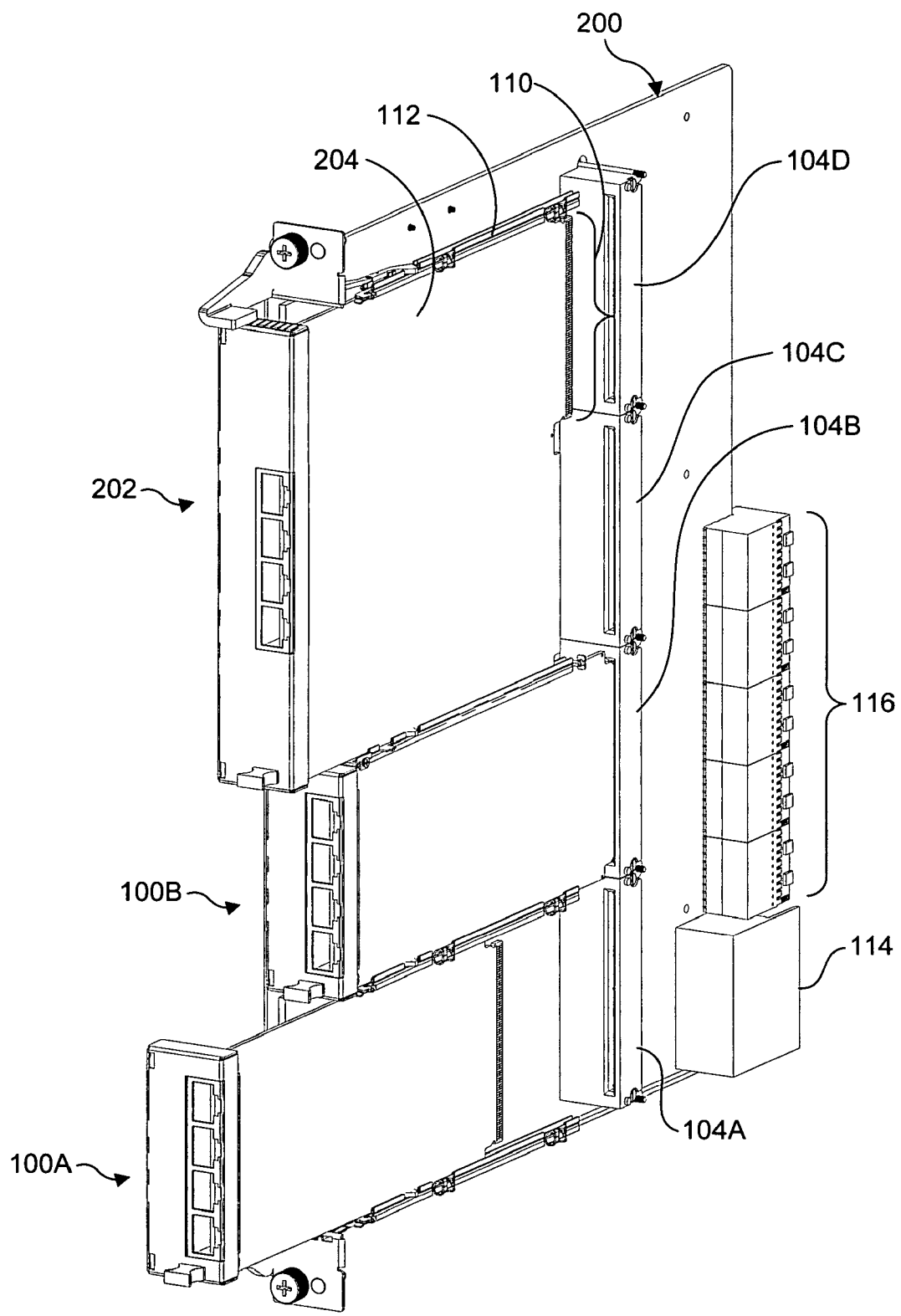
FIG. 2 is an isometric view of an ATCA carrier board to which to full-height single-width AdvancedMC modules and one conventional full-height double-width AdvancedMC module are coupled.
Figure 5B:
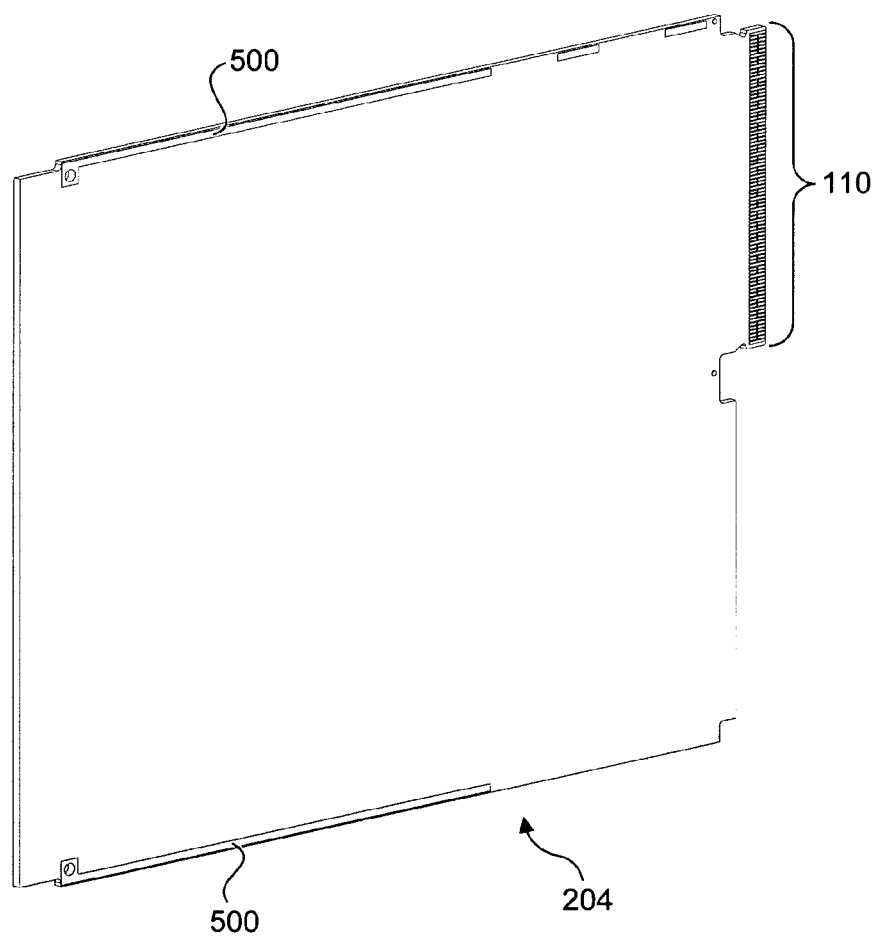
FIG. 5b is an isometric view of a double-width PCB card having a single edge connector used in a half-height or full-height double-width AdvancedMC module.

An ATCA carrier board 200 that supports a combination of single-width and double-width full-height AdvancedMC modules is shown in FIG. 2. As with the configuration of FIG. 1, ATCA carrier board 200 includes four full-height AdvancedMC connectors 104A, 104B, 104C, and 104D. Guide rails 112 are configured for receiving a pair of single-width full-height AdvancedMC modules 100A and 100B, as well as a double-width full-height AdvancedMC module 202. A double-width full-height module includes a double-width PCB card 204 including a single edge connector 110, as shown in FIG. 5b. Thus, when a conventional double-width full-height AdvancedMC module is installed, it is coupled to a single single-width full-height AdvancedMC connector 104.

Figure 3:
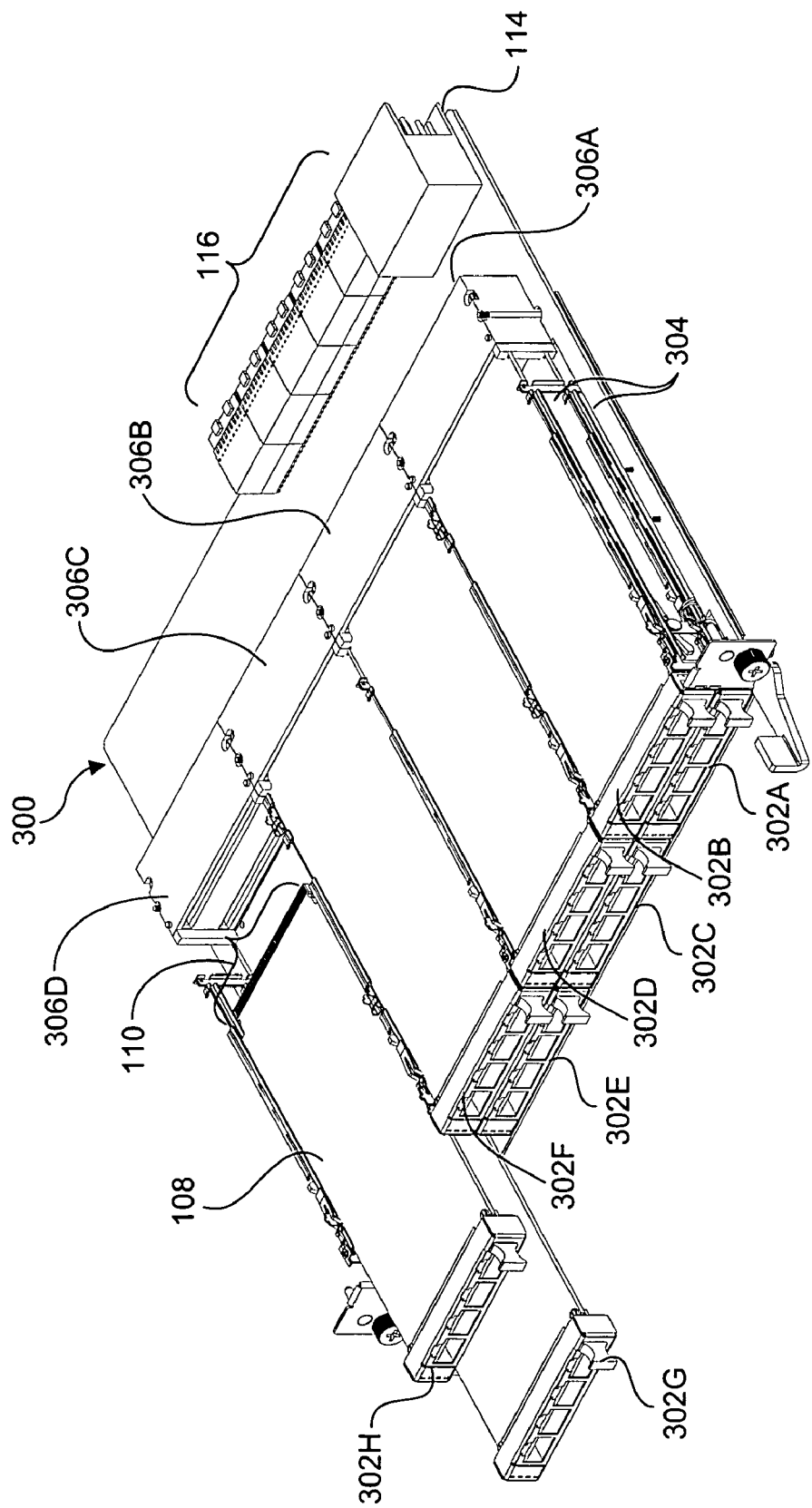
FIG. 3 is an isometric view of an ATCA carrier board to which to eight half-height single-width AdvancedMC modules are coupled.

In addition to full-height AdvancedMC modules, the AMC.0 specification defines use of single- and double-width half-height modules that may be stacked in a pair-wise manner that supports up to eight single-width, half-height modules. For example, such a configuration is shown in FIG. 3, which includes an ATCA carrier board 300 configured to support eight single-width single height AdvancedMC modules 302A, 302B, 302C, 302D, 302E, 302F, 302G, 302H. The configuration of a single-width board is the same whether it is used in a half-height or full-height AdvancedMC module. In the case of half-height modules, sets of dual-height rails 304 are employed to guide the card edges of each module.

ATCA carrier board 300 includes four AdvancedMC connectors 306A, 306B, 306C, and 306D. Each AdvancedMC connector has one of two possible configurations, referred to as style "AB" (for single-sided connections), and style A+B+ (for double sided connections). The lower connector slot on a AdvancedMC connector is referred to as slot "A", while the upper connector slot is referred to as slot "B," hence the names "AB" and "A+B+."

Figure 4:
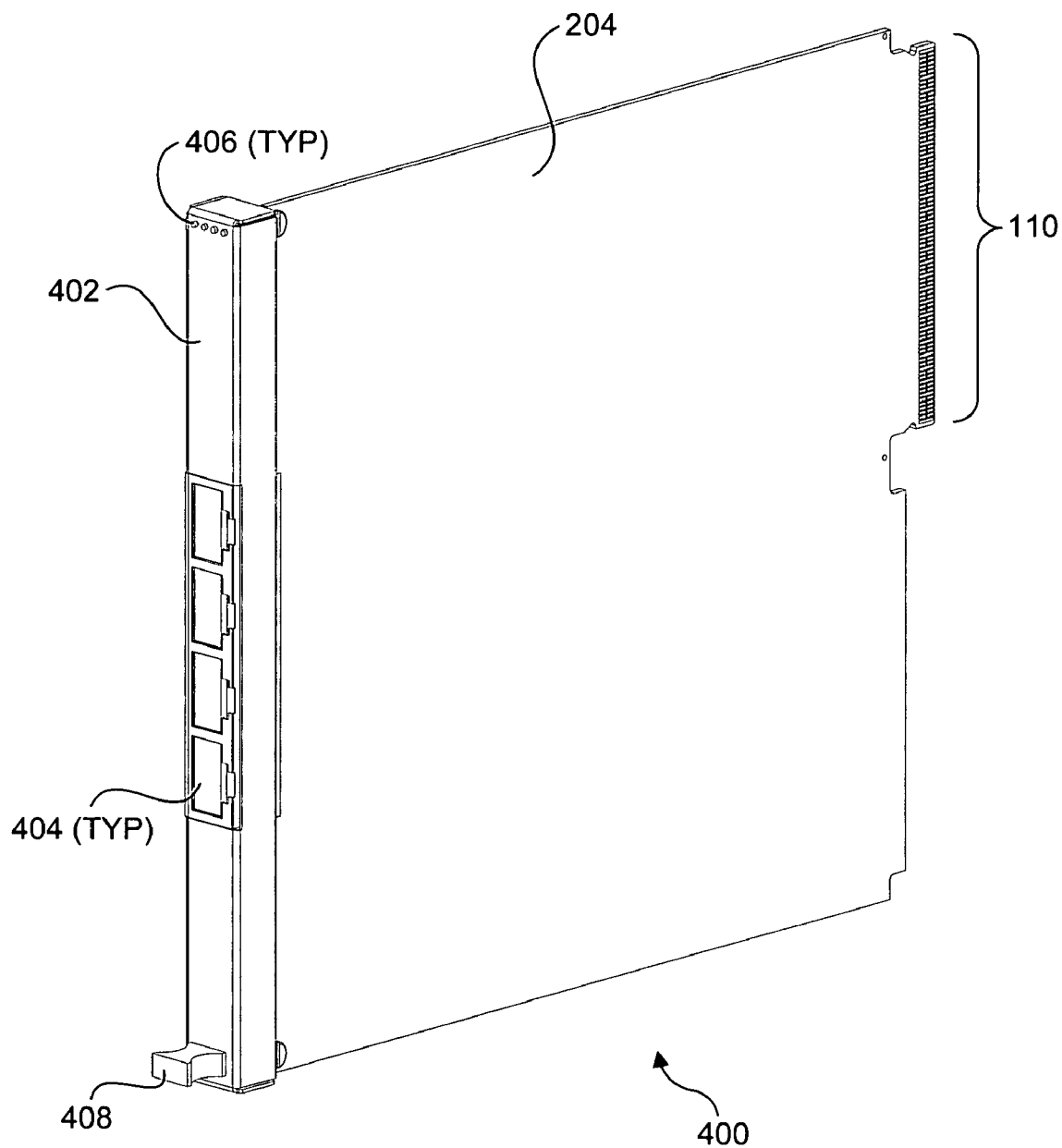
FIG. 4 is an isometric view of a half-height double-width AdvancedMC module.

An example of a conventional half-height double-width AdvancedMC module 400 is shown in FIG. 4. The module includes a double-width PCB board 204 with a single edge connector 110; as with single-width modules, the configuration of a double-width PCB card is the same whether it is used in a half-height or full-height AdvancedMC module. The module 400 further includes a half-height front panel 402 (also referred to as a "face plate") coupled to PCB card 204. The front panel may generally include provisions for various input/output (I/O) ports via which external devices may communicate with a module. For illustrative purposes, FIG. 4 shows four RJ-45 Ethernet jacks 404. Various other types of I/O ports may also be employed, including, but not limited to universal serial bus (USB) ports, serial ports, infared ports, and IEEE 1394 ports. (It is noted that mechanical interface for each port is typically coupled to the PCB card, with an appropriately-sized aperture defined in the front panel). A front panel may also include various indicators, such as light-emitting diodes (LEDs) 406, for example, as well as input switches (not shown). In addition, a front panel will typically include a handle or similar means for grasping a module when it is being installed or removed from a carrier board, such as depicted by a handle 408.

Further details of an AdvancedMC module single-width PCB card 108 are shown in FIG. 5*a*, while further details of an AdvancedMC module double-width PCB card 204 are shown in FIG. 5*b*. Each of PCB cards 108 and 204 include a pair of PCB electrostatic discharge strips 500 that are used to slidingly engage AdvancedMC guide rails 112 during insertion of the associated AdvancedMC module. In addition, each of single-width PCB card 108 and conventional double-width PCB card 204 include a respective edge connector 110 of identical configuration. The single-edge connector is configured to mate with a connector slot in an appropriately configured AdvancedMC connector, wherein the conductive traces at the edge of the PCB edge-connector (also referred to as contacts) act as male pins, which mate to a corresponding contacts (in the form of tiny balls that make contact to the traces on the AdvancedMC module edge connector) in the AdvancedMC connector slot. For example, a single-sided edge connector would require a B or AB style AdvancedMC connector. Similarly, a double-sided edge connector requires a B+ or A+B+ style AdvancedMC connector.

Figure 6:
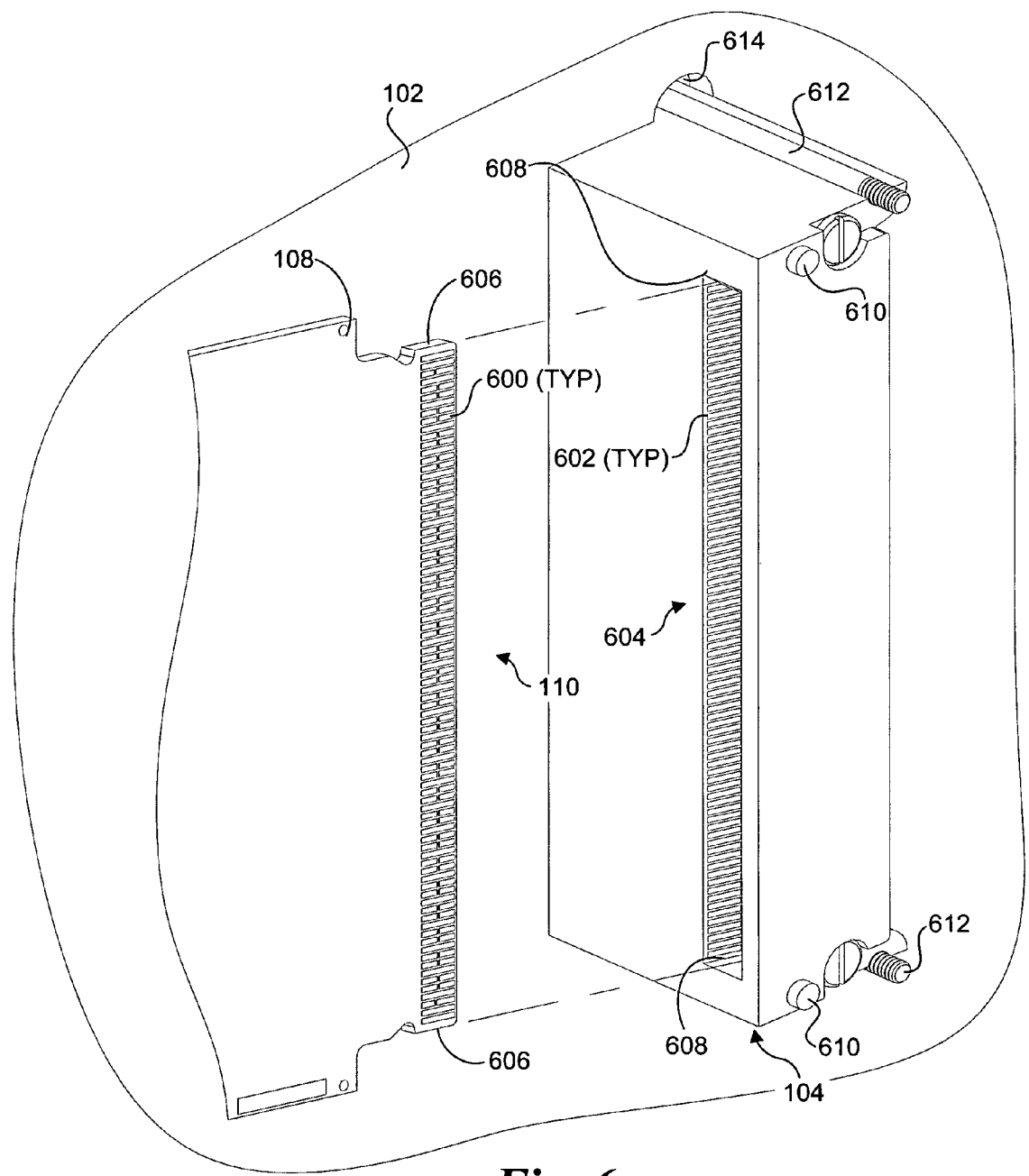
FIG. 6 is a detailed isometric view of the coupling and self-centering action between an edge connector and an AdvancedMC connector.

Details of an AdvancedMC module PCB board edge connector 110 and full-height AdvancedMC connector 104 are shown in FIG. 6. A single-sided edge connector includes 85 contacts 600, while a double-side edge connector includes 170 contacts 600 (85 on both sides). The pitch of the contacts is 0.75 millimeters mm. In order to accurately align the male edge connector contacts 600 with the corresponding female AdvancedMC connector contacts 602, a self-centering scheme is employed, such that the edge connector becomes centered within the AdvancedMC connector slot 604 upon insertion of an AdvancedMC module. This is accomplished via a sliding engagement between edges 606 of edge connector 110 with mating edges 608 formed on the inside of the connector slot 606 of full-height AdvancedMC connector 104. The tolerance between the mating parts is very tight to ensure high accuracy in the alignment of the mating electric contacts. Such high accuracy is required, in part, due to the high-frequency of the numerous I/O signals coupled via an AdvancedMC connector in view of the very small contact size and contact pitch.

Generally, double-width AdvancedMC modules are employed to provide functionality that either is not possible to implement on a single-width PCB card, or would otherwise be unfeasible or undesirable. For example, the board area of a single-width PCB card may be insufficient to support a layout area required for a particular set of components. While this is advantageous in some respects, it is a less then optimal solution, since only a single edge connection is available under the conventional approach. This limits both the number of I/O connections, as well as the aggregated power consumption of the module's circuitry.

More particularly, the maximum number of connections for a single-edge connector is 170 contacts, while the maximum power consumption for a given module is 35 watts. It is noted that both of these values is limited by the single-width AdvancedMC connector used to couple a single-width or double-width AdvancedMC module to the ATCA carrier board.

Figure 7:
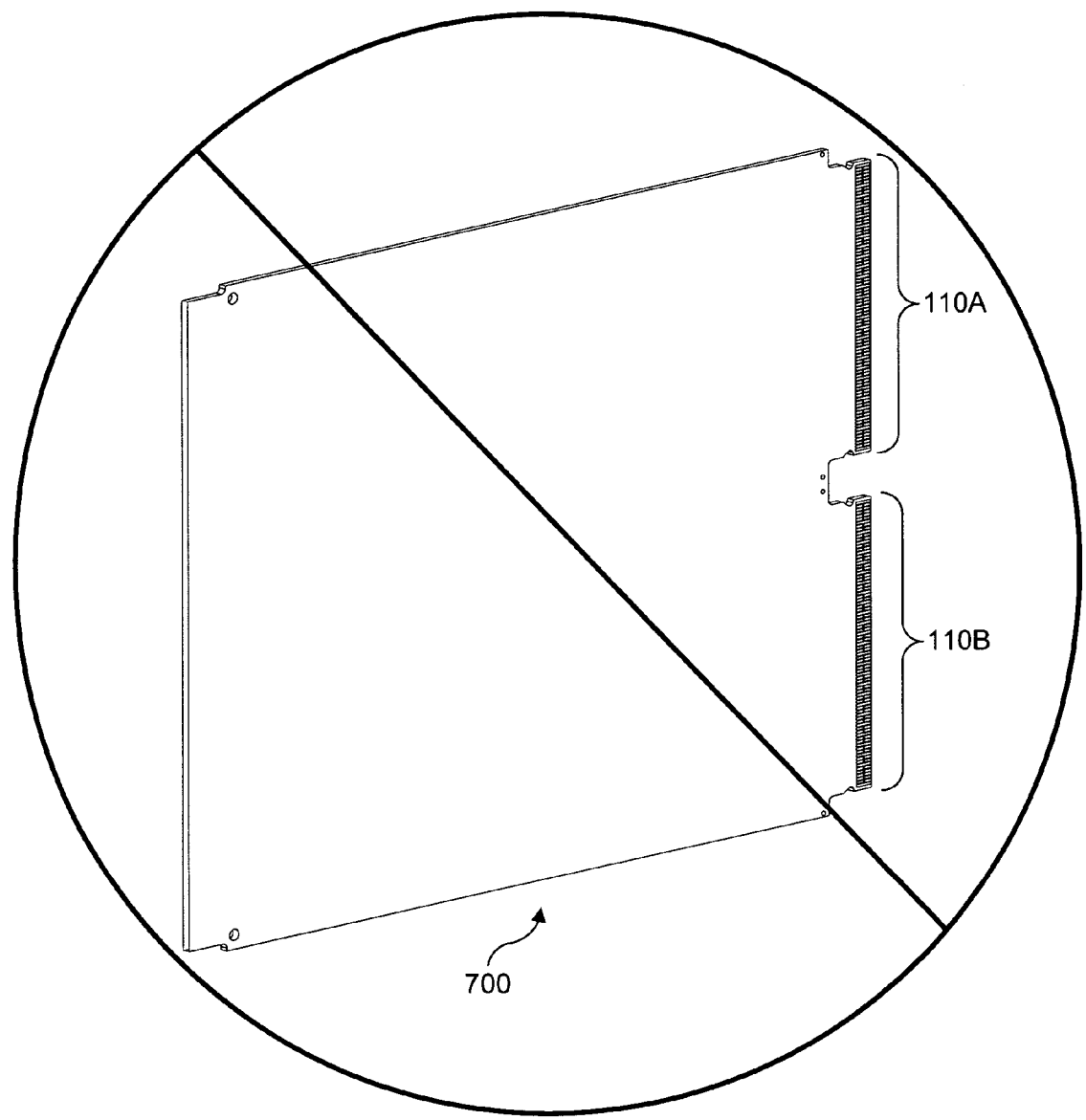
FIG. 7 is a schematic diagram of a double-width PCB card that is not allowed for use by the AMC.0 specification.

One technique for increasing available power and/or I/O connections would be to add a second edge connector to a double-width PCB card, such as depicted by a dual connector double-width PCB card 700 in FIG. 7, which includes two edge connectors 110A and 110B having the same configuration as edge connector 110. However, this technique, by itself, is not recommended by the AMC.0 specification for significant reasons. Notably, the mechanical tolerance stack-up between the various parts that are to be coupled together (e.g., the mechanical tolerance of the dimensions for the carrier board, the first and second single connectors, and the first and second edge connectors, as well as the alignment tolerance between the coupled components) does not guarantee that both edge connectors would be properly installed. For example, a given AdvancedMC connector (either full-height or half-height) is typically coupled to a carrier board 102 via multiple fasteners 610 and 612, as shown in FIG. 6. The mechanical tolerances between the fastener diameters and the corresponding holes via which the fastener shanks pass through the carrier board PCB (such as depicted by a hole 614) are relatively large, especially when compared with the connector tolerances. As a result, the distance between adjacent connectors could vary quite a bit.

This conflicts with the self-centering aspect of the connector design. Notably, the distance between the edge connectors 110A and 110B or dual connector double-width PCB card 700 is substantially fixed, while the distance between the slots in a pair of adjacent AdvancedMC connectors coupled to a carrier board is not. As the edge connectors engage the corresponding slots in the AdvancedMC connectors during card insertion, forces will be applied to each edge connector in an attempt to center that edge connector within its respective AdvancedMC connector slot. If the distances do not match, an excessive level of mechanical stress in the double-width PCB card and/or the carrier board and AdvancedMC connectors could be induced. Such mechanical stresses also could eventually damage one or more of the connectors, PCB card, and/or carrier board.

One technique for avoiding the mechanical stress would be to remove the self-centering feature of one of the two AdvancedMC single-width connectors. However, this would defeat the self-centering feature (which is used to ensure adequate alignment between PCB edge contacts and mating connector traces), possibly producing a situation under which inadequate signal-coupling exists. This is especially problematic when considering the multi-gigabit transfer rates of the serial I/O channels provided by ATCA-compliant interfaces, such as PCI Express. Another important factor is modifying an AdvancedMC connector in this manner would violate the AMC.0 specification.

Under embodiments of the invention discussed below, techniques are provided for enabling the circuitry in an AdvancedMC module to access signals from both connection slots in an AdvancedMC A+B+style connector simultaneous. In general, this is facilitated by a stacked dual edge connector configuration, wherein edge connectors for respective circuit boards are mechanically coupled to maintain a parallel offset that matches the offset of the slots in the dual-slotted stacked mating connector (e.g., AdvancedMC style A+B+ connector). Meanwhile, various means are provided for routing the signals between the edge connectors and circuit components on one or both circuit boards.

A first exemplary embodiment that concurrently couples signals between contacts in an A+B+ style AdvancedMC connector 800 and module circuitry is shown in FIGS. 8*a* and 8*b*. In general, each of the embodiments illustrated herein may be employed in an AdvancedMC module, which will typically include a faceplate and/or frame that is operatively coupled to either or both circuit boards (as applicable) in these embodiments. For the purpose of clarity, such faceplates and/or frames, as well as applicable coupling structure, are not shown in the Figures below. However, it will be readily recognized by those skilled in the mechanical arts how each of these embodiments could be packaged in an AdvancedMC module. Accordingly, corresponding details are not provided herein in order to not obscure inventive aspects of the embodiments.

The embodiment of FIGS. 8*a* and 8*b* includes an upper circuit board 802 and a lower circuit board 804, each of which includes an AdvancedMC edge connector 1 10 (hidden within AdvancedMC connector 800). For illustrative purposes, the upper and lower circuit boards 802 and 804, as well as the following embodiments discussed below, are depicted as single-width AdvancedMC cards, such as depicted in FIG. 5*a*. However, it will be understood that similar packaging techniques may be employed for AdvancedMC modules employing stacked double-width cards, such as shown in FIG. 5*b*.

The upper and lower circuit boards 802 and 804 are coupled together via multiple standoffs 806. These standoffs serve two purposes: they rigidly couple the two circuit boards together; and they maintain the edge connectors 110U and 110L of the boards in parallel with a board centerline at an offset distance D which matches the offset distance between the centerlines of the A and B slots in AdvancedMC connector 800. In the embodiments illustrated herein, the standoffs are depicted as internally threaded standoffs that are coupled between a pair of circuit boards with respective screws 810. However, it will be understood that other types of standoffs may be employed as well. In addition, other mechanical components for maintaining an offset distance between edge connectors 110U and 110L may be employed in a similar manner. For example, a spacer block could be mechanically coupled between the upper and lower circuit boards.

A connector 812 including a lower connector half 814 and an upper connector half 816 is used to coupled electrical signals between upper and lower circuit boards 802 and 804. Lower connector half 814 is mounted to lower circuit board 804 while upper connector half 816 is mounted to upper circuit board 802. In one embodiment, connector 812 comprises a pin and socket connector, where one half of the connector includes an array of pins and the other half includes an array of sockets, each configured to receive a respective pin.

In general, the embodiment of FIGS. 8*a* and 8*b* enables signals to be communicatively-coupled between at least one component on at least one of upper and lower circuit boards 802 and 804 and both of edge connectors 110U and 110L. For example, under one implementation of the embodiments described herein, an AdvancedMC module including a network processor unit (NPU) is employed, such as depicted by an NPU 818 in FIGS. 8*a–b*. Accordingly, appropriate signal paths 820 (e.g., traces including applicable vias, depicted as connection arrows for simplicity and clarity) are routed on upper circuit board 802 between edge connector 110U and NPU 818 using PCB manufacturing techniques well known in the electronic packaging arts. Additionally, appropriate signal paths 822 are routed on upper circuit board 802 between upper connector half 816 and NPU 818. Meanwhile, appropriate signal paths 824 are routed on lower circuit board 804 between edge connector 110L and lower connector half 814. Thus, NPU 818 is communicatively-coupled to edge connector 110U via signal paths 820 and to edge connector 100L via signal paths 822, connector 812 and signal paths 824.

Generally, circuit components, such as NPU 818, may be mounted on one or both sides of a given circuit board. Furthermore, in some embodiments, circuit components may be mounted on one of an upper or lower board, while the other board only is provided for routing signals between its edge connector and an applicable connector to the board having the mounted components. For illustrative purposes, exemplary components 830, NPU 818, and 832 are depicted in FIG. 8*b* as being mounted to the top side of upper circuit board 802, while components 834, 836 and 838 are mounted to the underside of the upper circuit board. Similarly, exemplary components 840 and 842 are depicted as being mounted to a top side of lower circuit board 804, while a component 844 is mounted to the underside of the lower circuit board. Under AdvancedMC terminology, the top side of an upper circuit board is component side B2, while the underside is component side B1. Meanwhile, the top side and underside of lower circuit board 804 are termed component side A2 and component side A1, respectively.

Figure 8C:
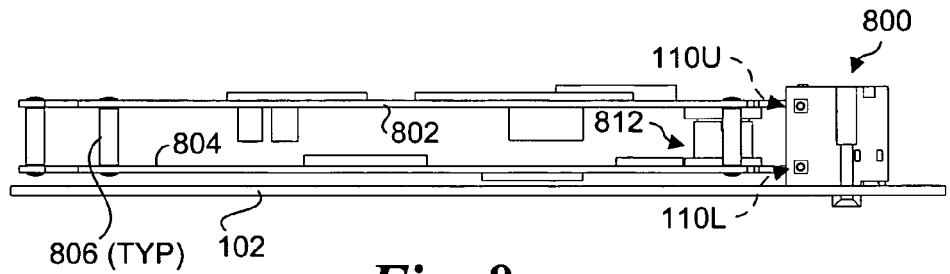
FIG. 8c shows an elevation view of an alternative configuration to the embodiment of FIGS. 8a and 8b, wherein the mating connector is located proximate to the edge connector ends of the upper and lower circuit boards.

FIG. 8*c* shows an alternate configuration for the embodiment of FIGS. 8*a* and 8*b*. Under this configuration, the upper and lower connector halves for connector 812 are mounted toward the edge connector ends of upper circuit board 802 and lower circuit board 804. This embodiment provides the advantage of having shorter signal paths between module components and the stacked edge connectors.

Figure 9A:
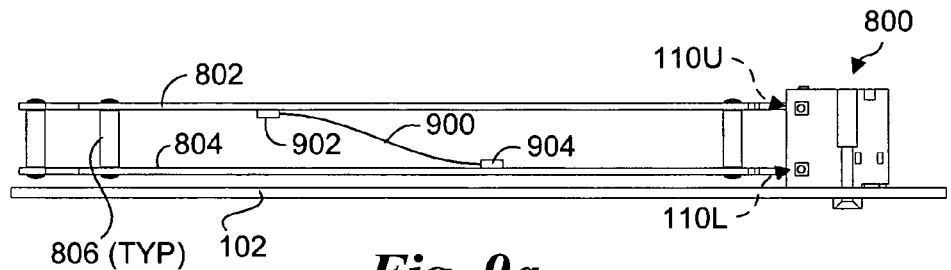
FIGS. 9a and 9b respectively show an elevation view and an isometric view of an embodiment of the invention that employs a flexible connector including a flex circuit to couple signals between the upper and lower circuit boards.
Figure 9B:
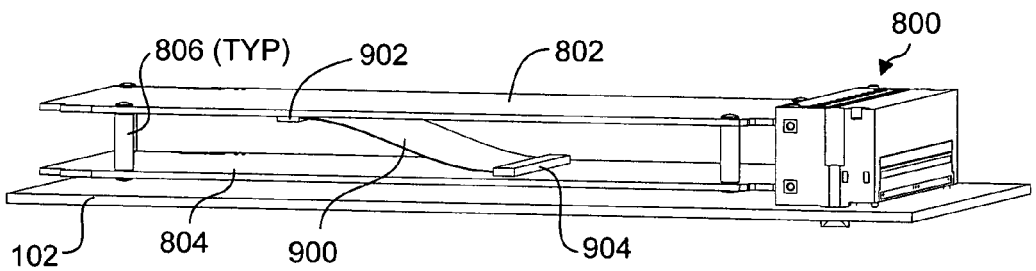

FIGS. 9*a* and 9*b* show an embodiment of the invention that employs a flexible connector comprising a flex circuit 900 connected to upper circuit board 802 and lower circuit board 804 at respective connector ends 902 and 904. In brief, the flexible connector provides functions similar to those provided by connector 812 in the embodiment of FIGS. 8*a–b*, wherein signal paths are routed between edge connector 110U to connector end 902 on upper circuit board 802 and signal paths are routed between edge connector 110L to connector end 904 on lower circuit board 804. To maintain the appropriate edge connector offset configuration, this illustrated embodiment also employs multiple standoffs 806.

Figure 9C:
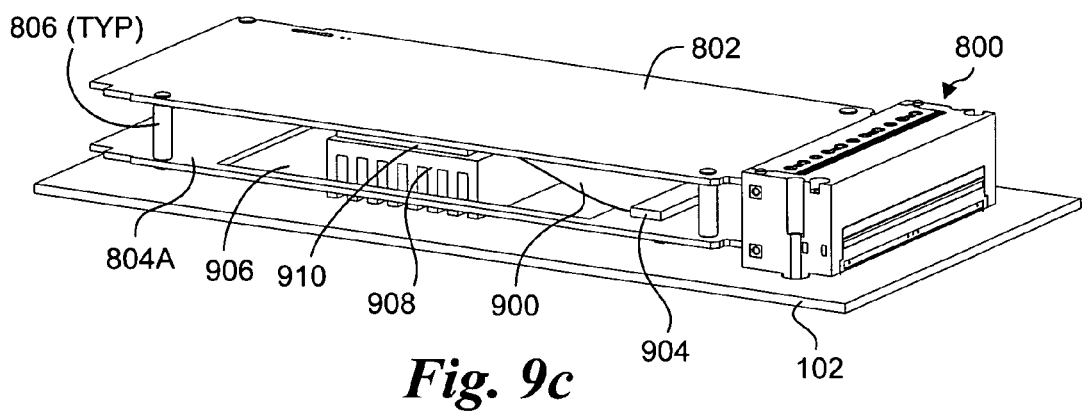
FIG. 9c shows an alternative configuration of the embodiment of FIGS. 9a and 9b, wherein the lower circuit board includes a cutout that enables components mounted to the underside of the upper circuit board to extend through the planar axis of the lower circuit board.

FIG. 9*c* shows an alternative configuration of the embodiment of FIGS. 9*a* and 9*b*. Under this configuration, a lower circuit board 804A is employed that includes a cutout 906. The cutout 906 enables components on the underside of upper circuit board 802 to extend into the cutout, as depicted by a heat sink 908 mounted to an integrated circuit 910 (e.g., an NPU or other type of processor). In another configuration (not shown), the upper circuit board includes a cutout and the lower circuit board is solid. Both of these configurations enable the use of components having a height that is greater than the offset distance between the upper and lower circuit boards.

Figure 10A:
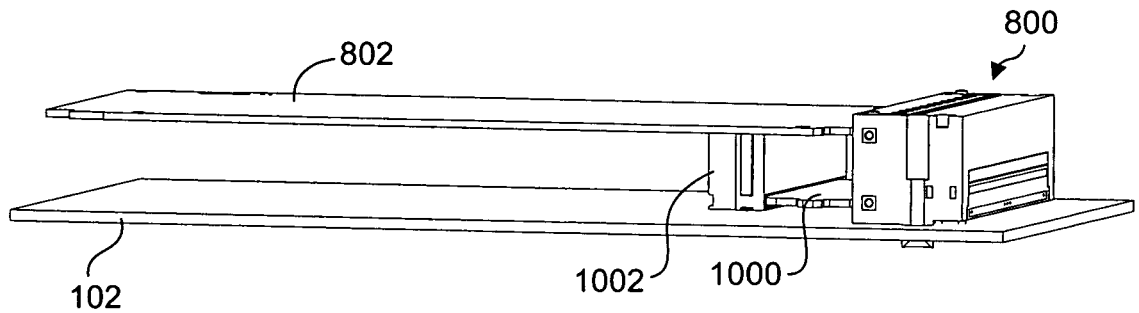
FIGS. 10a and 10b respectively show an isometric view and an elevational cross-section view of an embodiment of the invention that employs a lower circuit board with edge connectors at both ends.
Figure 10B:
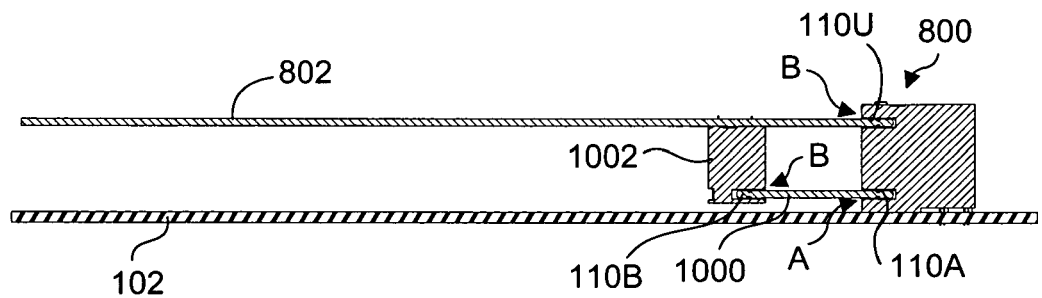
Figure 10C:
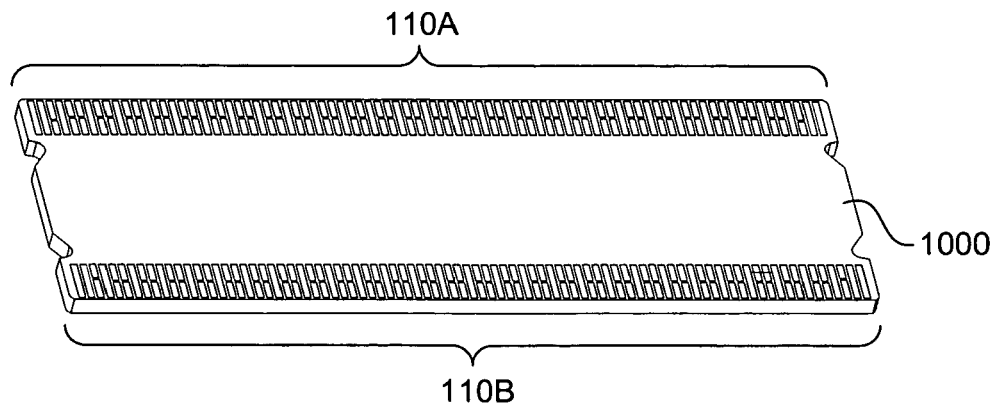
FIG. 10c shows an isometric view of the lower circuit board of FIGS. 10a and 10b.

FIGS. 10*a–c* show an embodiment of the invention that employs a lower circuit board 1000 that employs AdvancedMC edge connectors 110A and 110B at opposing ends. Edge connector 110B is inserted into slot B of a reduced height AdvancedMC connector 1002, which is mounted to upper circuit board 802, such that lower circuit board 1000 is cantilevered from the reduced height AdvancedMC connector, as shown. Upon installation of the module assembly (other module components, such as AdvancedMC faceplate not shown), edge connector 110U is inserted into slot B of AdvancedMC connector 800, while edge connector 110A is inserted into slot A of AdvancedMC connector 800. Under this configuration, respective traces (not shown) are formed in lower circuit board 1000 to couple respective pairs of contacts for edge connectors 100A and 110B.

Depending on the length of the lower circuit board 1000, it may be possible to implement the cantilevered configuration shown in FIGS. 10*a* and 10*b* without employing additional support members, such as standoffs and the like. For example, this will generally be the case if the length of lower circuit board 1000 is approximately 20% or less of the length of upper circuit board 802. In one embodiment, edge connector 110B of lower circuit board 1000 is mechanically secured in slot B of reduced height AdvancedMC connector 1002 using an appropriate means, such as an epoxy or fasteners.

In one embodiment (not shown), an integrated component having a configuration similar to reduced height AdvancedMC connector 1002 and circuit board 1000 is employed. Under this embodiment, signal paths are directly coupled between pins extending from the base of the connector to respective contacts on edge connector 110A, without employing edge connector 110B.

Figure 11A:
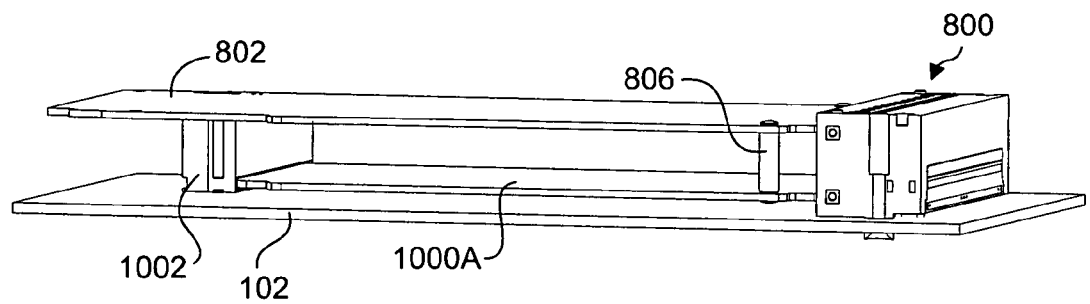
FIGS. 11a and 11b respectively show an isometric view and an elevational cross-section view of an alternative configuration to the embodiment of FIGS. 10a and 10b, wherein a longer lower circuit board with edge connectors at both ends is used.
Figure 11B:
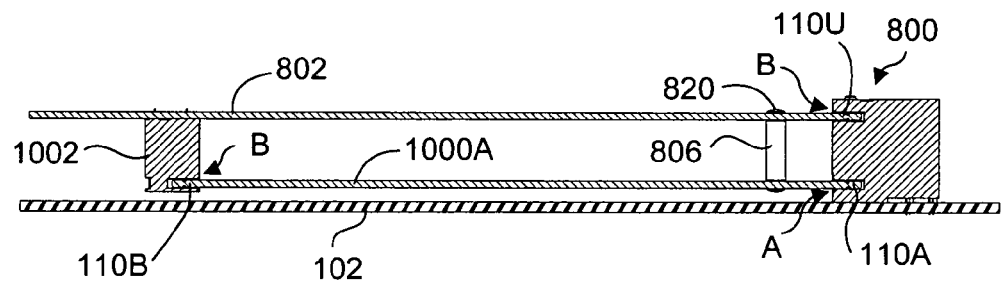
Figure 11C:
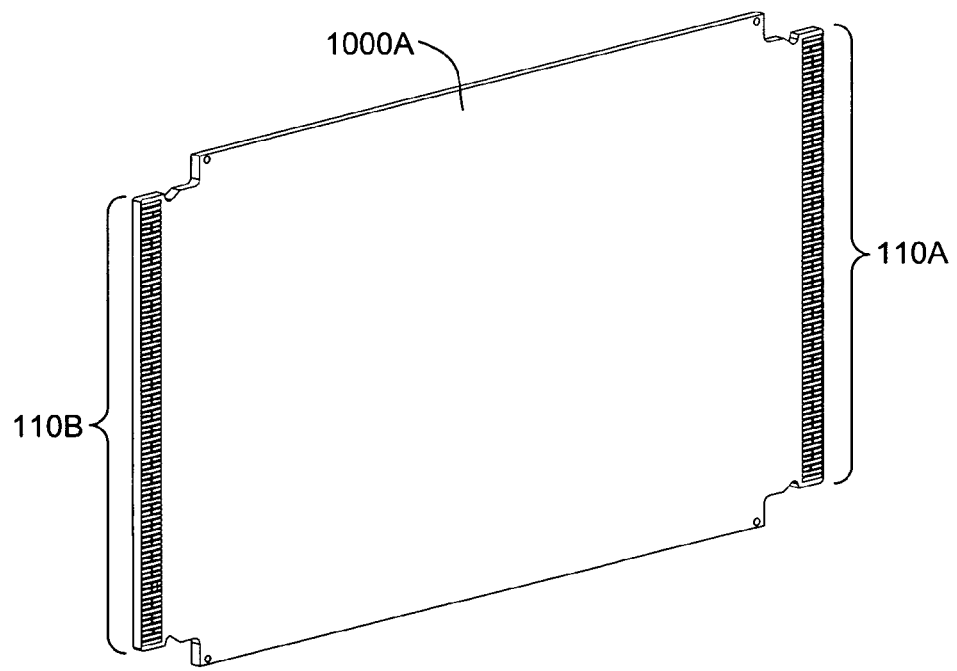
FIG. 11c shows an isometric view of the lower circuit board of FIGS. 11a and 11b.

FIGS. 11*a–c* shown an alternative configuration to the embodiment of FIGS. 10*a–c*. Under this configuration, all components sharing like reference numbers perform similar functions to those shown in FIGS. 10*a–c* and discussed above. However, lower circuit board 1000 is replaced with a longer lower circuit board 1000A, which spans a substantial portion of upper circuit board 802. As before, edge connector 110B is inserted into slot B of reduced height AdvancedMC connector 1002 such that lower circuit board 1000A extends from the connector in a cantilevered fashion. However, since the cantilever distance is much longer in this embodiment, a means for maintaining an appropriate offset distance between edge connectors 110U and 110A should be employed. In the illustrated embodiment, this function is provided by a pair of standoffs 806.

In the context of the ATCA AdvancedMC module configurations shown in FIGS. 1–4, AdvancedMC modules may be configured to employ aspects of the embodiments discussed above. For example, an AdvancedMC module may be implemented using the embodiment of FIGS. 8*a–b* by coupling an AdvancedMC faceplate to upper circuit board 802 and/or lower circuit board 804. In is noted that such modules would not include an AdvancedMC connector 800, which is included in the Figures herein to illustrate the interface between the edge connectors of the module's upper and lower circuit boards and the AdvancedMC connector to which they are configured to mate. As discussed above, the principles and teachings herein may be employed for AdvancedMC modules employing single-width AdvancedMC cards, or double-width AdvancedMC cards.

In addition, the principles and teachings herein may be applied to other implementations in addition to the AdvancedMC implementations described herein. Furthermore, AdvancedMC modules may be employed in non-ATCA environments in addition to the ATCA implementations depicted in FIGS. 1–4.

Furthermore, the foregoing exemplary embodiments employing two stacked edge connections is merely illustrative of the possible module configuration. Similar principles may be applied to modules having three or more stacked edge connections.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the drawings. Rather, the scope of the invention is to be determined entirely by the following claims, which are to be construed in accordance with established doctrines of claim interpretation.

What is claimed is:

1. An apparatus comprising:
   a carrier board,
   a first circuit board having a first edge connector;
   a second circuit board having a second edge connector at one end of the second circuit board and a third edge connector at an opposing end of the second circuit board;
   a first slotted connector, having a first slot into which the first edge connector is inserted and a second slot into which the second edge connector is inserted and having a base mounted to the carrier board, the first and second circuit boards extending outward from the slotted connector in a cantilevered fashion;
   a second slotted connector, having a third slot into which the third edge connector is inserted and having a base mounted to the first circuit board, the second circuit board extending outward from the slotted connector in a cantilevered fashion; and
   means for maintaining a parallel offset distance between the first and second circuit boards.

2. The apparatus of claim 1, further comprising:
   a flex circuit, coupled between the second circuit board and the first circuit board.

3. The apparatus of claim 1, wherein the second circuit board includes a cutout through which one or more components on the first circuit board extend.

4. The apparatus of claim 1,
   wherein the second circuit board includes traces for routing signals between respective contacts in the second edge connector and respective contacts in the third edge connector.

5. The apparatus of claim 1, wherein the means for maintaining the offset distance comprises:
   a plurality of standoffs disposed proximate to the first and second edge connectors and providing an offset between the first and second circuit boards at first ends of the first and second circuit boards; and
   wherein the second slotted connector is used to maintain an offset distance between the first and second circuit boards at second ends of the first and second circuit boards opposite the first ends.

6. The apparatus of claim 1, wherein the second circuit board has a length that is 20% or less than a length of the first circuit board.

7. The apparatus of claim 1, wherein the second circuit board has a length that spans a substantial portion of the length of the first circuit board; and the apparatus further comprises a plurality of standoffs disposed between the first and second circuit boards towards the first and second edge connector ends of the first and second circuit boards.

8. The apparatus of claim 1, wherein the first, second and third edge connectors are Advanced Mezzanine Card ("AdvancedMC") edge connectors.

9. The apparatus of claim 1, wherein the first slotted connector is an AdvancedMC connector and the second slotted connector is a reduced height style B+ AdvancedMC connector.

10. The apparatus of claim 1, wherein the first circuit board includes at least one component mounted thereto.

11. The apparatus of claim 10, wherein the first circuit board includes circuitry to communicatively couple the at least one component to the first edge connector.

12. The apparatus of claim 10, wherein the second circuit board includes circuitry to communicatively couple the at least one component to the second edge connector via the second slotted connector.

13. The apparatus of claim 10, wherein the at least one component is a network processor unit.

14. The apparatus of claim 1, wherein at least one of the first and second circuit boards comprises a double-width AdvancedMC card.

15. An apparatus, comprising:
   a carrier board;
   a first circuit board having a first edge connector;
   a second circuit board having a second edge connector at one end of the second circuit board and a third edge connector at an opposing end of the second circuit board;
   a first slotted connector, having a first slot into which the first edge connector is inserted and a second slot into which the second edge connector is inserted and having a base mounted to the carrier board, the first and second circuit boards extending outward from the slotted connector in a cantilevered fashion; and
   a second slotted connector, having a third slot into which the third edge connector is inserted and having a base mounted to the first circuit board, the second circuit board extending outward from the slotted connector in a cantilevered fashion.

16. The apparatus of claim 15, further comprising:
   a flex circuit, coupled between the second circuit board and the first circuit board.

17. The apparatus of claim 15, wherein the second circuit board includes a cutout through which one or more components on the first circuit board extend.

18. The apparatus of claim 15, further comprising at least one standoff disposed between the first and second circuit boards to maintain a parallel offset distance between the first and second circuit boards.

19. The apparatus of claim 18, wherein the at least one standoff is disposed proximate to the first and second edge connectors at first ends of the first and second circuit boards, wherein the second slotted connector is used to maintain a parallel offset distance between the first and second circuit boards at second ends of the first and second circuit boards opposite the first ends.

* * * * *